(12) United States Patent  
Araki et al.

(10) Patent No.: US 6,828,661 B2  
(45) Date of Patent: Dec. 7, 2004

(54) LEAD FRAME AND A RESIN-SEALED SEMICONDUCTOR DEVICE EXHIBITING IMPROVED RESIN BALANCE, AND A METHOD FOR MANUFACTURING THE SAME

(75) Inventors: Masanao Araki, Katano (JP); Hideo Uchida, Amagasaki (JP); Takashi Ono, Takatsuki (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/153,699

(22) Filed: May 24, 2002

(65) Prior Publication Data

US 2003/0001244 A1 Jan. 2, 2003

(30) Foreign Application Priority Data

Jun. 27, 2001 (JP) ........................................ 2001-194115

(51) Int. Cl.[7] ........................ H01L 23/495; H01L 23/48
(52) U.S. Cl. ........................ 257/676; 257/666; 257/684; 257/692; 257/693; 257/730
(58) Field of Search ................................. 257/666, 668, 257/669, 670–672, 674–676, 684, 712, 796, 690–693, 730–733, 784, 689, 667, 699

(56) References Cited

U.S. PATENT DOCUMENTS 6,208,020 B1 * 3/2001 Minamio et al. ........... 257/684

FOREIGN PATENT DOCUMENTS

| JP | 2-52357 | 4/1990 |
| JP | 10--242369 | 9/1998 |
| JP | 200077600 | * 3/2000 |
| JP | 2000-243891 | 9/2000 |
| JP | 2000-294717 | 10/2000 |
| JP | 2001-24133 | 1/2001 |

* cited by examiner

*Primary Examiner*—Long Pham  
*Assistant Examiner*—Dilinh Nguyen  
(74) *Attorney, Agent, or Firm*—McDermott Will & Emery LLP

(57) ABSTRACT

A lead frame has a die pad portion supported internally of a framework portion by suspension leads and a plurality of leads each having one end connected to the framework portion and the other end opposed to the die pad portion. The die pad portion has a holding region formed from a part of an upper surface of the die pad portion which has been elevated above the remaining part of the upper surface. Openings are formed in the holding region to extend therethrough in a front-to-back direction of the die pad portion.

5 Claims, 10 Drawing Sheets

LEAD FRAME AND A RESIN-SEALED SEMICONDUCTOR DEVICE EXHIBITING IMPROVED RESIN BALANCE, AND A METHOD FOR MANUFACTURING THE SAME

BACKGROUND OF THE INVENTION

The present invention relates to a lead frame including leads each having a land electrode at an external terminal thereof, to a resin-sealed semiconductor device of land grid array (LGA) type using the lead frame, and to a method for fabricating the same.

With the recent miniaturization of electronic equipment, high-density mounting has been required of semiconductor components including resin-sealed semiconductor devices. To meet the requirement, the semiconductor components have been reduced increasingly in size and thickness. In particular, the resin-sealed semiconductor devices have been increased in the number of pins used therein, while they have been reduced in size and thickness. As a result, a resin-sealed semiconductor device which allows high-density pin placement has been in growing demand.

Referring to the drawings, a lead frame used in a conventional resin-sealed semiconductor device will be described.

FIGS. 9A and 9B show a conventional lead frame of QFP (quad flat package) type, of which FIG. 9A shows a plan structure thereof and FIG. 9B shows a cross-sectional structure thereof along the line IXb—IXb of FIG. 9A.

As shown in FIG. 9A, a lead frame 100 has: a square framework portion 101; a tie-bar portion 102 provided internally of the framework portion 101; suspension leads 103; a die pad portion 104 supported by each of the corners of the die-bar portion 102 and by the suspension leads 103; a plurality of inner leads 105 having respective one ends connected to the tie-bar portion 102 and the respective other ends opposing the die pad portion 104; and outer leads 106 having respective one ends connected to the framework portion 101 and the respective other ends connected to the inner leads 105 via the tie-bar portion 102.

As shown in FIG. 9B, the die pad portion 104 has a chip carrying surface pressed down by a depressing process to be lower in level than the top surfaces of the inner leads 105. The lead frame 100 shown in FIG. 9A is normally arranged in a repeated pattern in the same plane.

FIG. 10 shows a cross-sectional structure of a conventional resin-sealed semiconductor device using the lead frame 100.

As shown in FIG. 10, the conventional resin-sealed semiconductor device has a semiconductor chip 107 fixedly attached onto the die pad portion 104 by using a soldering material or the like. The semiconductor chip 107 is electrically connected to the individual inner leads 105 by metal fine wires 108.

The components disposed internally of the tie-bar portion 102 shown in FIG. 9A, i.e., the semiconductor chip 107, the die pad portion 104, and the inner leads 105 are sealed integrally with a sealing resin material to form a resin-sealed portion 109. The tie-bar portion 102 serves as a resin stopper during the injection of the sealing resin material. After the framework portion 101 is cut away, the tie-bar portion 102 is divided in such a manner as to insulate the outer leads 106 adjacent to each other. The outer leads 106 protruding from each of the side surfaces of the resin sealed portion 109 are processed (by bending) to have respective end portions which are nearly flush with the bottom surface of the resin-sealed portion 109.

In the conventional lead frame 100, however, the width of each of the inner and outer leads 105 and 106 (hereinafter referred to as the leads 105 and 106) is limited if a plurality of semiconductor elements are formed at a higher density in the semiconductor chip 107 and a larger number of pins are used. In such a multi-pin configuration, the number of the leads 105 and 106 is increased accordingly so that the size of the whole lead frame 100 is increased disadvantageously. As a result, the whole resin-sealed semiconductor device is naturally increased in size, which prevents the resin-sealed semiconductor device from being reduced in size and thickness.

If the number of the leads 105 and 106 is increased without changing the outer size of the lead frame 100, the width of each of the leads 105 and 106 should be reduced, which makes it difficult to perform processing such as etching in the fabrication of the lead frame 100.

As a semiconductor device of surface-mount type, there has recently been developed a resin-sealed semiconductor device of, e.g., so-called ball grid array (BGA) type or land grid array (LGA) type wherein a semiconductor chip placed on the top surface of a carrier (wiring board) having external electrodes such as ball electrodes or land electrodes provided on the bottom surface thereof is electrically connected and sealed with a resin. Such a semiconductor device of surface-mount type is mounted on a mother board (mounting board) at the bottom surface thereof and has been becoming mainstream.

Under the circumstances, the problem has been encountered that a semiconductor device of QFP type, i.e., the conventional lead frame 100 in which external electrodes composed of the outer leads 106 are formed only on the side surfaces of the package (resin sealed portion 109) shown in FIG. 10 is incompatible with the grid array type.

On the other hand, the semiconductor device of BGA or LGA type has the problem that production cost cannot easily be reduced since it uses a relatively high-cost carrier (wiring board) as a member for holding a semiconductor chip.

SUMMARY OF THE INVENTION

It is therefore an object of the present invention to solve the foregoing conventional problems and thereby provide a lead frame which allows bottom surface mounting by using a frame member integrally formed with a die pad. Another object of the present invention is to increase the reliability of a resin-sealed semiconductor device using the frame member.

To attain the object, a lead frame according to the present invention comprises: a die pad portion supported internally of a framework portion by suspension leads; and a plurality of leads each having one end connected to the framework portion and the other end opposed to the die pad portion, the die pad portion having a holding region formed from a part of an upper surface of the die pad portion which has been elevated above the remaining part thereof, the holding region having an opening formed to extend therethrough in a front-to-back direction of the die pad portion.

If the lead frame according to the present invention is sealed with a resin such that the respective bottom surfaces of the leads are exposed from the bottom surface of a package, the bottom surfaces of the leads form external terminals. This allows an LGA-type package to be implemented by using a frame member without using a wiring board. Since the opening is formed in the holding region for a semiconductor chip to extend therethrough in the front-to-back direction, a sealing resin material is also filled in a space underlying the bottom surface of the die pad portion through the opening so that each of the upper and lower sides of the die pad portion is covered with the sealing resin material. As a result, so-called "resin balance" which is the balance between the resin residing in the die pad portion and the resin residing in the semiconductor chip is improved. The improved resin balance prevents the peeling off of the resin or a crack caused in the resin sealed portion by a thermal stress resulting from the difference between the respective thermal expansion coefficients of the die pad portion and the sealing resin material or between those of the semiconductor chip and the sealing resin material and thereby prevents a crack occurring in the semiconductor chip. Accordingly, the reliability of a resin-sealed semiconductor device using the lead frame according to the present invention is increased significantly.

In one aspect of the lead frame according to the present invention, the opening formed in the holding region preferably includes a plurality of openings and one of the openings is provided preferably at a position opposing a position at which an injection gate for a sealing resin material is disposed. In the arrangement, the sealing resin material injected from the injection gate is supplied consistently through the openings positioned in opposing relation to the position at which the injection gate is disposed to the space underlying the holding region. This prevents the occurrence of a void in the resin material filled in the space underlying the holding region.

In another aspect of the lead frame according to the present invention, the opening formed in the holding region preferably includes four openings, the holding region preferably has connecting sections provided between the adjacent openings and a center holding section having a square plan configuration defined by the respective inner edges of the surrounding openings which connect the adjacent connecting sections to each other, and an angle formed between a direction in which the inner edge of at least one of the openings extends and a direction in which the framework portion extends is preferably set to about 45°.

A resin-sealed semiconductor device according to the present invention comprises: a die pad portion; a semiconductor chip bonded to an upper surface of the die pad portion; a plurality of leads disposed around the die pad portion to be electrically connected to the semiconductor chip by using conductor wires and having respective bottom surfaces exposed; and a resin sealed portion composed of a resin sealing material for integrally sealing the semiconductor chip, the die pad portion, and the plurality of leads, the die pad portion having a holding region formed from a part of an upper surface of the die pad portion which has been elevated above the remaining part thereof, the holding region having an opening formed to extend therethrough in a front-to-back direction of the die pad portion.

Since the resin-sealed semiconductor device according to the present invention is formed by using the lead frame according to the present invention, the sealing resin material is filled also in the space underlying the die pad portion through the opening formed in the holding region of the die pad portion. As a result, each of the upper and lower sides of the die pad portion is covered with the sealing resin material. This prevents the peeling off of the resin, a crack, or the like caused in the resin sealed portion or the semiconductor chip by a thermal stress and thereby increases the reliability of the resin-sealed semiconductor device.

In one aspect of the resin-sealed semiconductor device according to the present invention, the opening formed in the holding region preferably includes a plurality of openings and one of the openings is provided preferably at a position opposing a position at which an injection gate for a sealing resin material used in forming the resin sealed portion is disposed.

In another aspect of the resin-sealed semiconductor device according to the present invention, the opening formed in the holding region preferably includes four openings, the holding region preferably has connecting sections provided between the adjacent openings and a center holding section defined by the respective inner edges of the surrounding openings which connect the adjacent connecting sections to each other and having a square plan configuration, and an angle formed between a direction in which the inner edge of at least one of the openings extends and a direction in which the framework portion extends is preferably set to about 45°.

In the resin-sealed semiconductor device according to the present invention, the sealing resin material is preferably filled also in a space underlying the holding region of the die pad portion.

In the resin-sealed semiconductor device according to the present invention, that one of the plurality of leads disposed externally of the resin sealed portion preferably has a bottom surface and a side end surface each exposed from the resin sealed portion.

In this case, the plurality of leads are preferably arranged in at least two rows around the die pad portion.

A method for fabricating a resin-sealed semiconductor device according to the present invention comprises: a first step of preparing a lead frame comprising a die pad portion supported internally of a framework portion by suspension leads and a plurality of leads each having one end connected to the framework portion and the other end opposed to the die pad portion: a second step of bonding a semiconductor chip onto the die pad portion; a third step of electrically connecting the semiconductor chip to the plurality of leads by using conductor wires; a fourth step of integrally sealing the semiconductor chip, the die pad portion, and the plurality of leads with a sealing resin material; and a fifth step of separating the resin sealed portion from the framework portion, the die pad portion of the lead frame having a holding region formed from a part of an upper surface of the die pad portion which has been elevated above the remaining part thereof, the holding region having an opening formed to extend therethrough in a front-to-back direction of the die pad portion.

Since the method for fabricating a resin-sealed semiconductor device according to the present invention fabricates a resin-sealed semiconductor device by using the lead frame according to the present invention, the sealing resin material is filled also in the space underlying the bottom surface of the die pad portion through the opening formed in the holding region of the die pad portion in the resin sealing step. As a result, each of the upper and lower sides of the die pad portion is covered with the sealing resin material. This prevents the peeling off of the resin, a crack, or the like caused in the resin sealed portion or the semiconductor chip by a thermal stress and thereby increases the reliability of the resin-sealed semiconductor device.

In one aspect of the method for fabricating a resin-sealed semiconductor device according to the present invention, the opening formed in the holding region preferably includes a plurality of openings and one of the openings is provided preferably at a position opposing a position at which an injection gate for the sealing resin material is disposed.

In another aspect of the method for fabricating a resin-sealed semiconductor device according to the present invention, the opening formed in the holding region of the lead frame preferably includes four openings, the holding region preferably has connecting sections provided between the adjacent openings and a center holding section having a square plan configuration defined by the respective inner edges of the surrounding openings which connect the adjacent connecting sections to each other, and an angle formed between a direction in which the inner edge of at least one of the openings extends and a direction in which the framework portion extends is preferably set to about 45°.

Preferably, the method for fabricating a resin-sealed semiconductor device according to the present invention further comprises, between the third step and the fourth step, the step of: attaching a sealing sheet material to respective bottom surfaces of the framework portion, the die pad portion, and the plurality of leads such that the sealing sheet material is in close contact therewith.

BRIEF DESCRIPTION OF THE DRAWINGS

FIGS. 2A to 2C show the die pad portion of the lead frame according to the first embodiment, of which FIG. 2A is a plan view, FIG. 2B is a cross-sectional view taken along the line IIb—IIb of FIG. 2A, and FIG. 2C is a cross-sectional view taken along the line IIc—IIc of FIG. 2A;

FIGS. 3A to 3C show the lead and land lead of the lead frame according to the first embodiment, of which FIG. 3A is a plan view, FIG. 3B is a cross-sectional view of the lead taken along the line IIIb—IIIb of FIG. 3A, and FIG. 3C is a cross-sectional view of the land lead taken along the line IIIc—IIIc of FIG. 3A;

FIGS. 4A and 4B show a resin-sealed semiconductor device according to a second embodiment of the present invention, of which FIG. 4A is a plan view and FIG. 4B is a bottom view;

FIGS. 5A and 5B show the resin-sealed semiconductor device according to the second embodiment, of which FIG. 5A is a cross-sectional view taken along the line Va—Va of FIGS. 4A and 4B and FIG. 5B is a cross-sectional view taken along the line Vb—Vb of FIGS. 4A and 4B;

FIGS. 9A and 9B show a conventional lead frame, of which FIG. 9A is a plan view and FIG. 9B is a cross-sectional view taken along the line IXb—IXb of FIG. 9A.

DETAILED DESCRIPTION OF THE INVENTION

Embodiment 1

A first embodiment of the present invention will be described with reference to the drawings.

Figure 1:
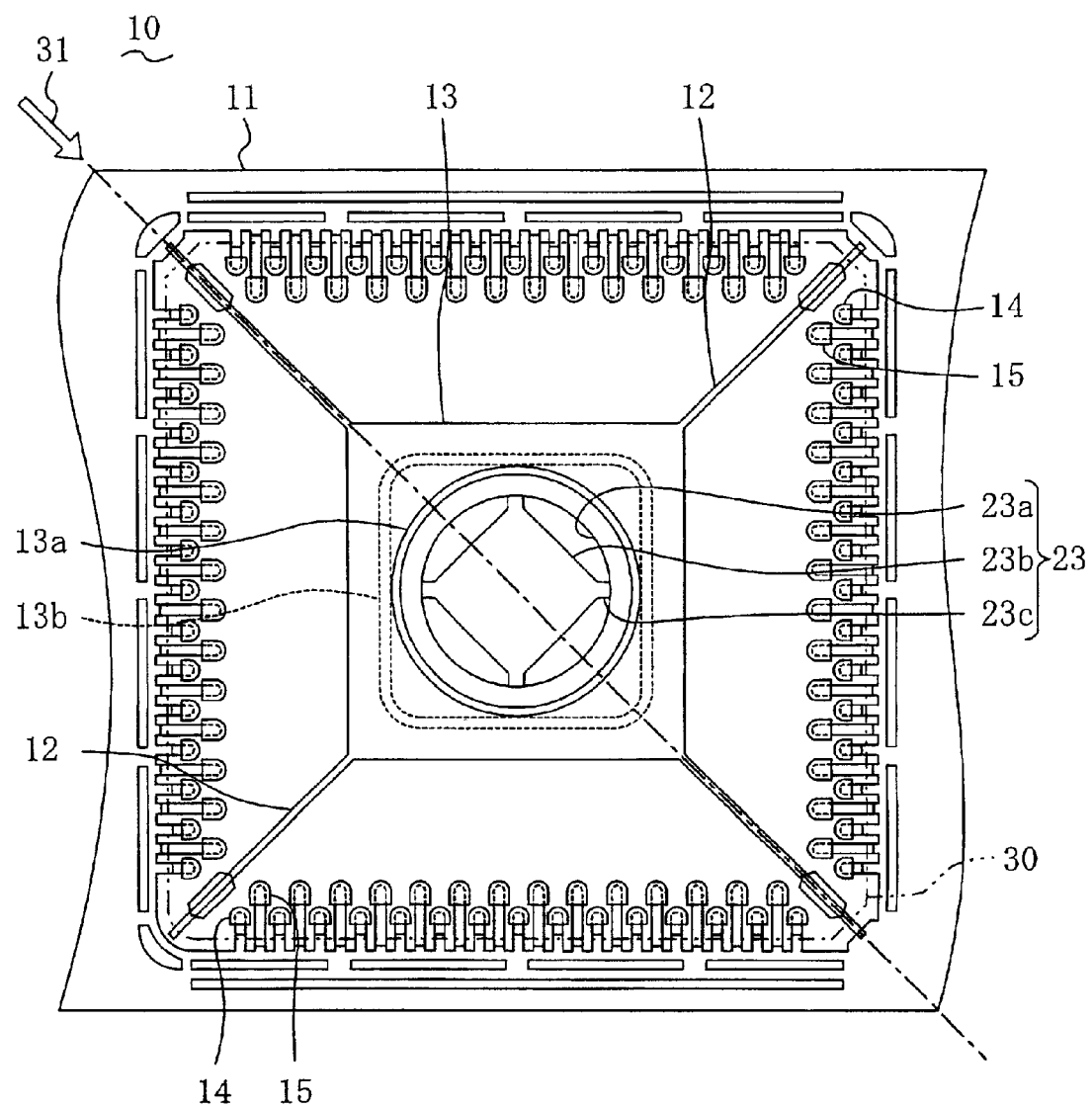
FIG. 1 is a plan view showing a lead frame according to a first embodiment of the present invention.

FIG. 1 shows a plan structure of a lead frame according to the first embodiment.

As shown in FIG. 1, a lead frame 10 according to the first embodiment has: a framework portion 11 having a square plan configuration; suspension leads 12; a die pad portion 13 supported at the center portion of the lead frame 10 by each of the corner of the framework portion 11 and by the suspension leads 12; a plurality of leads 14 having respective one ends connected to the framework portion 11 and the respective other ends opposed to the side surfaces of the die pad portion 13; and a plurality of land leads 15 disposed between the adjacent leads 14 in alternate relation and having respective one ends connected to the framework portion 11 and the respective other ends positioned closer to the die pad portion 13 than the other ends of the leads 14.

The lead frame 10 is composed of a copper alloy or an iron alloy termed "42-alloy" having a plate-like configuration, which is used normally. The die pad portion 13, the lead 14, and the like are formed integrally with the framework portion 11. The inner region 30 of the framework portion 11 represents a region sealed by a sealing resin material.

The first embodiment is characterized in that the die pad portion 13 having a generally square plan configuration has a holding region 23 at the center portion thereof. The holding region 23 is composed of the center portion of the die pad portion 13 that has been elevated. Four openings 23a each having an arcuate plan configuration are formed in the peripheral portion of the holding region 23 so that a region defined by the inner edges of the surrounding openings 23a which correspond to the chords thereof serves as a section substantially holding the semiconductor chip, which is a center holding section 23b having a square plan configuration. The individual corners of the center holding section 23b are connected to the die pad portion 13 by connecting sections 23c provided between the adjacent openings 23a. The plan configuration of the die pad portion 13 is not limited to a square.

The arrow 31 shown in FIG. 1 indicates a direction in which an injection gate through which a sealing resin material is injected in a resin sealing step is disposed. The sealing resin material is injected from the direction indicated by the arrow 31 toward the die pad portion 13. At that time, one of the four openings 23a is provided preferably at a position opposing the position at which the injection gate is disposed. In the arrangement, the connecting sections 23c are shifted from the direction in which the injection gate is disposed so that, when the injected sealing resin material flows through the openings 23a of the holding region 23, the connecting sections 23c do not obstruct the flow of the sealing resin material. Consequently, the sealing resin material is filled consistently in the space underlying the holding region 23 so that a void or the like does not occur in the sealing resin material filled in the space underlying the holding region 23.

If the center holding section 23b of the die pad 13 has, e.g., a generally square plan configuration and the injection gate is disposed diagonally of the center holding section 23b, each of the edges of the center holding section is shifted from the framework portion 11 by about 45°.

Figure 2A:
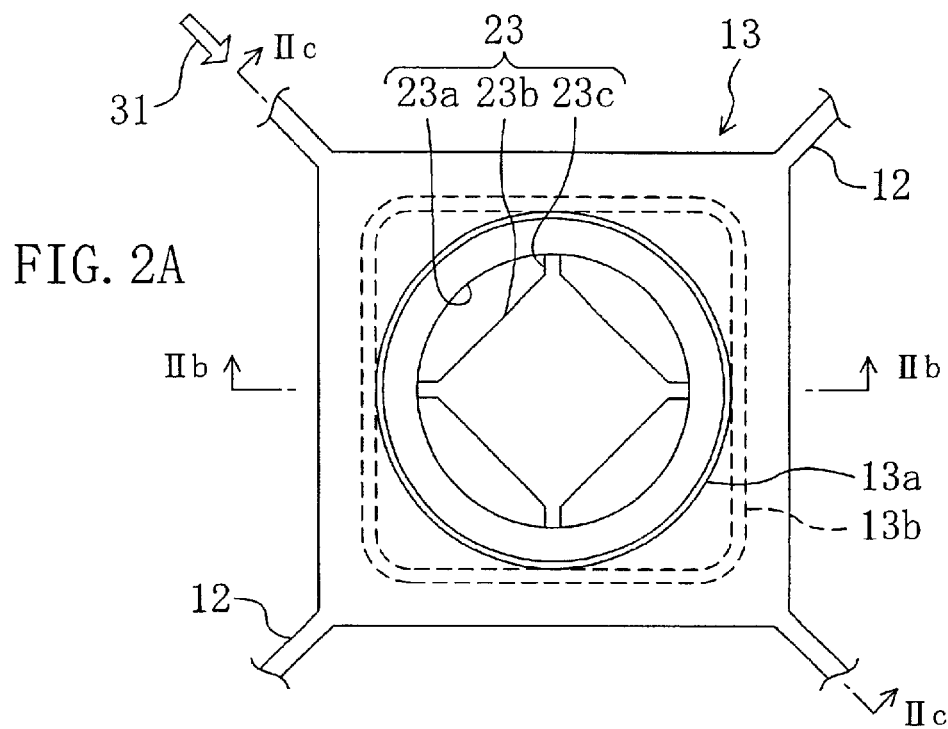
Figure 2B:
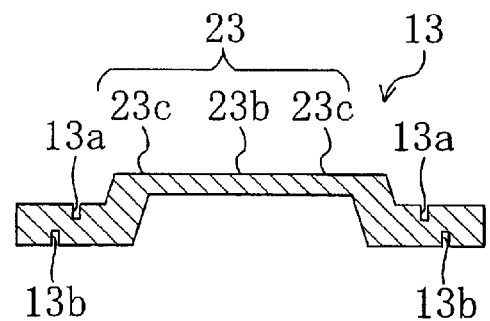
Figure 2C:
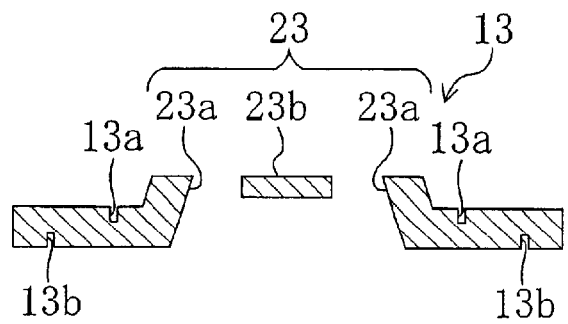

FIGS. 2A to 2C show, under magnification, a plan structure and cross-sectional structures of the die pad portion 13. In FIGS. 2A to 2C, components which are the same as those shown in FIG. 1 are designated at the same reference numerals. As shown in FIGS. 2B and 2C, the holding region 23 of the die pad portion 13 is formed to protrude upward from the periphery of the die pad portion 13 by a pressing process which brings the holding region 23 into a half-cut state. Consequently, the bottom surface of the holding region 23 of the die pad portion 13 is elevated above the surrounding region so that a space is formed under the holding region 23. In the resin sealing step, therefore, the sealing resin material is filled in the space formed under the holding region 23 through each of the openings 23a.

Specifically, if the die pad portion 13 has a thickness of about 200 μm, the holding region 23 is formed at a position elevated above the other region of the die pad portion 13 by about 50 to 100 μm (corresponding to about 25% to 50% of the thickness thereof). Since the holding region 23 has been formed by elevating the center portion of the die pad portion 13, if a semiconductor chip having a bottom surface which is larger in area than the holding region 23 is held on the holding region 23, another space is also formed between the bottom surface of the semiconductor chip and the periphery of the die pad portion 13.

Although each of the openings 23a has an arcuate plan configuration (aperture configuration) in the first embodiment, the configuration of the opening is not limited thereto. It may be an ellipse, a rhomboid, or a triangle. Accordingly, the plan configuration of the center holding section 23b defined by the surrounding openings 23a is not limited to a square, either. If each of the openings 23a has, e.g., a rhombohedral configuration, the center holding section 23b has a cross-shaped configuration. Thus, the plan configuration of each of the openings 23a and the center holding section 23b may be determined appropriately based on the area of the bottom surface of a semiconductor chip held on the top surface.

However, each of the openings 23a is preferably configured as an arc as configured in the first embodiment for the following reasons. For one thing, the sealing resin material flows smoothly through the opening 23a since the outer arcuate section of the opening 23a has no angular portion and therefore a sufficient mechanical strength is sustained. For another, the area of the center holding section 23b can relatively be increased since the inner chordal section of the opening 23a is linear.

As shown in FIG. 1 and FIGS. 2A to 2C, a first annular groove 13a having a plan circular configuration is formed in the top surface of the die pad portion 13 in such a manner as to surround the holding region 23. Since the injected sealing resin material fills in the first annular groove 13a, even if the sealing resin material peels off the top surface of the die pad portion 13 under a stress resulting from thermal expansion, the peeling off of the sealing resin material can be stemmed by the first annular groove 13a so that the reliability of the resin-sealed semiconductor device using the lead frame 10 is increased. The first annular groove 13a may have a circular or square plan configuration. In the first place, the configuration of the first annular groove 13a need not necessarily be annular. For example, two or more discrete groove portions may be formed in an irregular pattern. The number, configurations, and arrangement of the groove portions may be determined appropriately based on the area of the die pad portion 13 and the area of the semiconductor chip held thereon.

On the other hand, a second annular groove 13b having a square plan configuration with rounded corners is formed in the bottom surface of the die pad portion 13 in such a manner as to surround the holding region 23. When the semiconductor device is mounted on a mounting board by applying a bonding material (bonding material) such as a soldering material to the bottom surface of the die pad portion 13, the second annular groove 13b thus provided prevents the bonding material from flowing to the periphery of the die pad portion 13 so that the accuracy with which the semiconductor device is mounted on the mounting board is increased. In addition, the second annular groove 13b can also absorb a thermal stress received by the die pad portion 13 as a result of heat dissipation from the semiconductor chip. The plan configuration of the second annular groove 13b is not limited to a square, either. Additionally, a third annular groove may also be provided internally or externally of the second annular groove 13b.

The first embodiment is also characterized by the leads 14 and the land leads 15.

The respective bottom surfaces of the leads 14 and the land leads 15 constitute external terminals (land portions). In particular, the leads 14 can also be connected electrically to the mounting board not only at the bottom surfaces thereof but also at the cut end surfaces thereof (side end surfaces) disconnected from the framework portion 11 to serve as external terminals.

As shown in FIG. 1, the leads 14 and the land leads 15 are formed alternately in the framework portion 11 such that the respective end portions of the land leads 15 are positioned closer to the die pad portion 13 than those of the leads 14. If the lead frame 10 thus constructed is sealed with a resin, two rows of external terminals are arranged in a staggered pattern at the marginal portion of the bottom surface of the resin sealed portion (package). This allows the lead frame 10 composed of a plate-like metal member to implement a package of land grid array (LGA) type without using a wiring board.

A detailed description will be given herein below to the structure of the leads 14 and the land leads 15 with reference to the drawings.

Figure 3A:
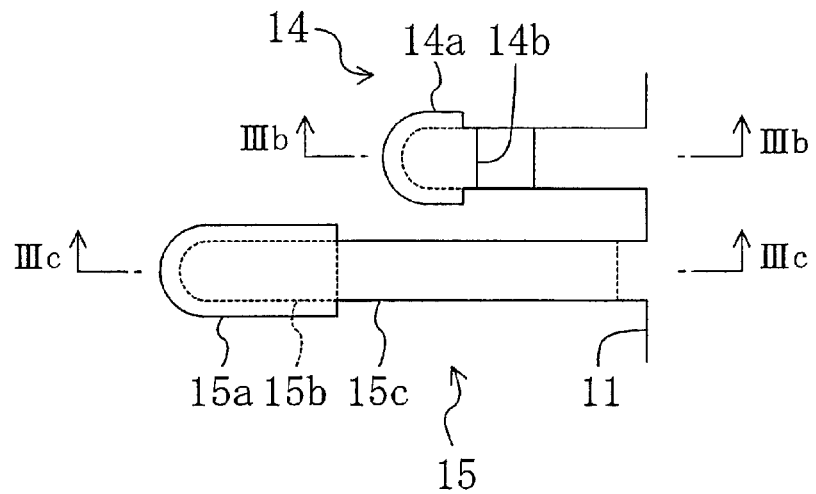
Figure 3B:
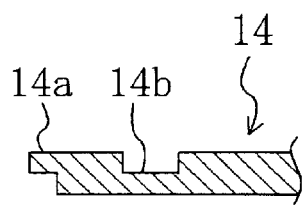
Figure 3C:
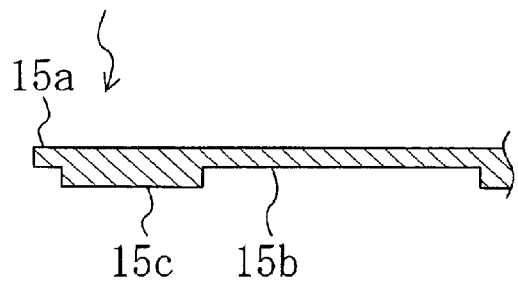

FIGS. 3A to 3C show the lead and land lead of the lead frame according to the first embodiment, of which FIG. 3A shows a plan structure thereof, FIG. 3B shows a cross-sectional structure of the lead along the line IIIb—IIIb of FIG. 3A, and FIG. 3C shows a cross-sectional structure of the land lead along the line IIIc—IIIc of FIG. 3A.

As shown in FIGS. 3A and 3B, the leads 14 are linear leads each having a rounded end portion and a protruding portion 14a formed by a half-etching process in the upper edge of the end portion to serve as a bonding pad portion. A recessed portion 14b is also formed by a half-etching process in the region of the top surface of each of the leads 14 which is positioned between the framework portion 11 and the protruding portion 14a. After the semiconductor chip is sealed with a resin, the entire bottom surfaces of the leads 14 are exposed to form the land portions.

As shown in FIGS. 3A and 3C, the land leads 15 are also linear leads each having a rounded end portion and a protruding portion 15a formed by a half-etching process in the upper edge of the end portion to serve as a bonding pad portion. A thinned portion 15b is also formed by a half-etching process in the region of the bottom surface of each of the land leads 15 which is positioned between the framework portion 11 and the protruding portion 15a. Accordingly, the section of the bottom surface of each of the land leads 15 other than the thinned portion 15b, i.e., the end portion thereof including the protruding portion 15c serves as the land portion 15c.

After the resin-sealing step, the resin-sealed semiconductor device fabricated by using the lead frame 10 according to the first embodiment has a single-side sealed configuration in which the leads 14 have their bottom surfaces and side end surfaces disconnected from the framework portion 11 exposed. Unlike the leads of a full-molded package such as the QFP type shown in the conventional embodiment, the leads 14 may receive a stress resulting from the sealing resin material or a stress after the semiconductor device is mounted on the board.

To prevent this, the first embodiment has formed the recessed portions 14b in the top surfaces of the leads 14 so that, even if the stress resulting from the sealing resin material, the stress after the semiconductor device is mounted on the board, or the like is applied to the leads 14, the applied stress is absorbed by the recessed portions 14b. This prevents destruction at the connecting sections of bonded metal fine wires and maintains the reliability of the semiconductor device high after it is mounted.

The number of the leads 14 and the land leads 15 may be determined appropriately based on the number of the pins of a semiconductor chip to be placed.

The lead frame 10 according to the first embodiment has a plated surface. If necessary, a plating process is performed with respect thereto after a metal such as nickel (Ni), palladium (Pd), or gold (Au) is deposited thereon.

The lead frame 10 depicted covers only a region corresponding to one semiconductor device. In the actual situation, a pattern corresponding to one semiconductor devices is formed repeatedly.

It is also possible to provide the suspension leads 12 with dummy land portions or with curved portions.

Thus, the lead frame 10 according to the first embodiment has the framework portion 11 provided with the leads 14 and the land leads 15 which are different in length and alternately arranged in a so-called staggered pattern. This allows the formation of an LGA-type package from a frame member composed of a plate-like metal.

The die pad portion 13 for holding the semiconductor chip has the holding region 23 composed of the elevated center portion of the die pad portion 13. The holding region 23 is provided with the openings 23a for allowing the passage of the flow of the sealing resin material toward the space underlying the bottom surface of the die pad portion 13. The openings 23a allow the sealing resin material to be filled in the space underlying the bottom surface of the die pad portion 13 so that the resin balance between the space overlying the top surface of the die pad portion 13 and the space underlying the bottom surface thereof is improved. This prevents the peeling off of the sealing resin material, a crack occurring in the semiconductor chip or the resin material, and the like.

Since the opening 23a formed in the holding region 23 is provided at a position opposing the position at which the injection gate for the sealing resin material is disposed, the connecting sections 23c supporting the center holding section 23b defined by the surrounding openings 23a are shifted to positions which do not obstruct the flow of the injected sealing resin material. This provides a consistent flow of the sealing resin material to be filled in the space underlying the die pad portion 13 and prevents the occurrence of a defect such as a void in the resin sealed portion 41 formed under the die pad portion 13. As a result, the reliability of the resin-sealed semiconductor device is increased accordingly.

Since the injected sealing resin material is filled also in the space underlying the die pad portion 13, the pressure exerted by the injected resin material on the semiconductor chip held on the holding region 23 is reduced. This prevents the displacement of the semiconductor chip.

Embodiment 2

A second embodiment of the present invention will be described with reference to the drawings.

Figure 4A:
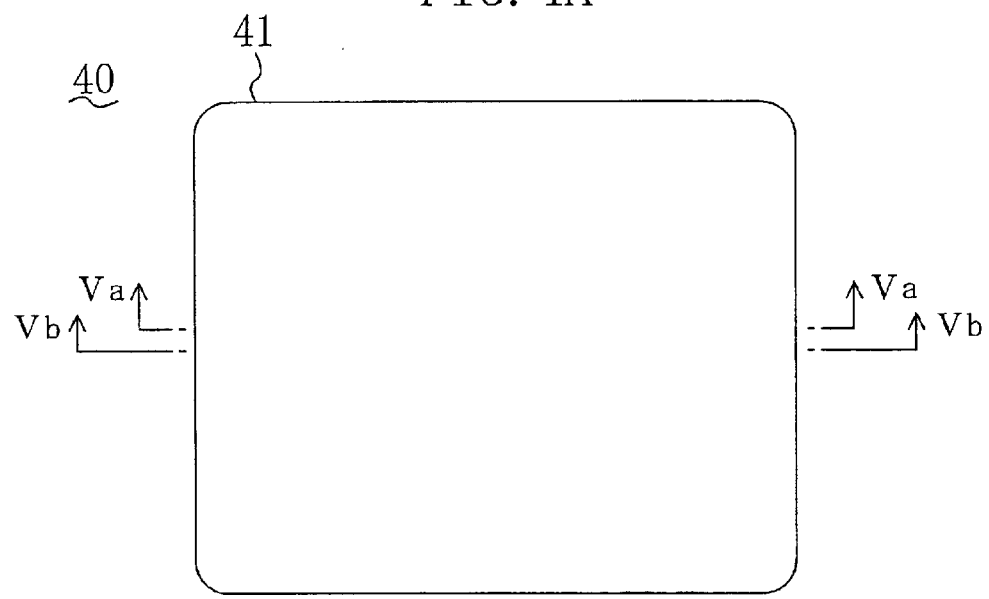
Figure 4B:
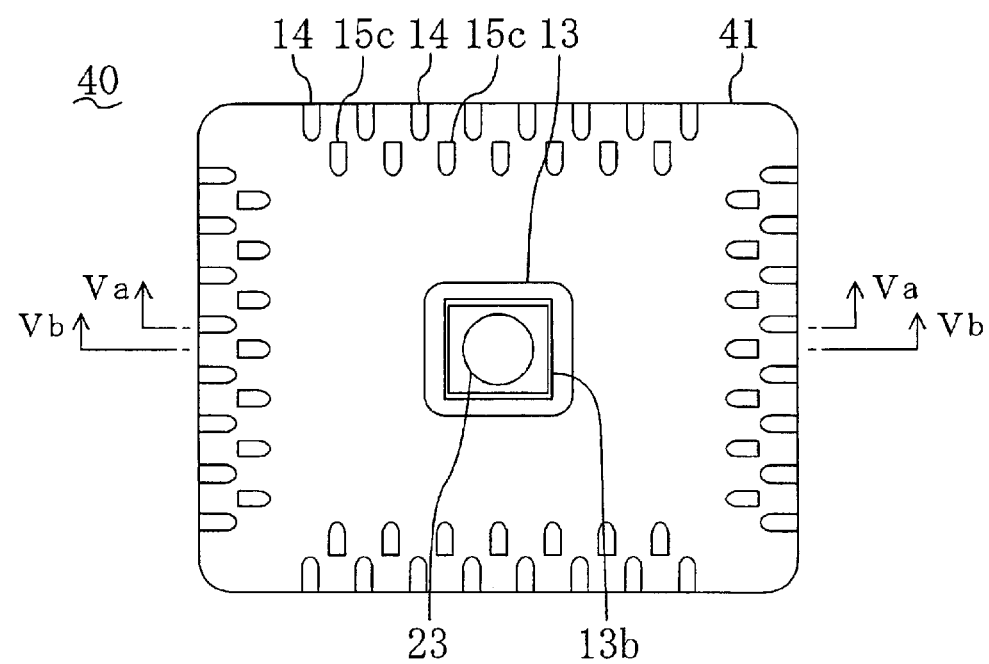

FIGS. 4A and 4B show a resin-sealed semiconductor device according to the second embodiment, of which FIG. 4A shows a plan structure thereof and FIG. 4B shows a bottom structure thereof.

The resin-sealed semiconductor device according to the second embodiment is fabricated by using the lead frame according to the first embodiment of the present invention. In FIGS. 4A and 4B and FIGS. 5A and 5B, therefore, components which are the same as those shown in FIG. 1 and FIGS. 3A to 3C are designated at the same reference numerals.

As shown in FIG. 4A, the top surface of the resin-sealed semiconductor device 40 according to the second embodiment is entirely covered with the resin sealed potion 41 composed of the sealing resin material.

As shown in FIG. 4B, the bottom surfaces of the leads 14 disposed on the periphery of resin-sealed semiconductor device 40 and the bottom surfaces of the land portions 15c of the land leads 15 disposed between the adjacent leads 14 and internally thereof are exposed in a staggered pattern at the bottom surface of the resin sealed portion 41 of the resin-sealed semiconductor device 40. The bottom surface of the die pad portion 13 is also exposed at the center of the bottom surface of the resin sealed portion 41. The resin sealed portion 41 composed of the sealing resin material filled through the plurality of openings 23a described in the first embodiment is exposed internally of the holding region 23 of the die pad portion 13.

The bottom surfaces of the leads 14 thus exposed at the bottom surface of the resin sealed portion 41, the side end surfaces thereof, and the bottom surfaces of the land portions 15c of the land leads 15 serve as two rows of land electrodes (external electrodes) in a staggered pattern when the semiconductor device is mounted on a mounting board such as a printed board.

A description will be given herein below to the internal structure of the resin-sealed semiconductor device 40.

Figure 5A:
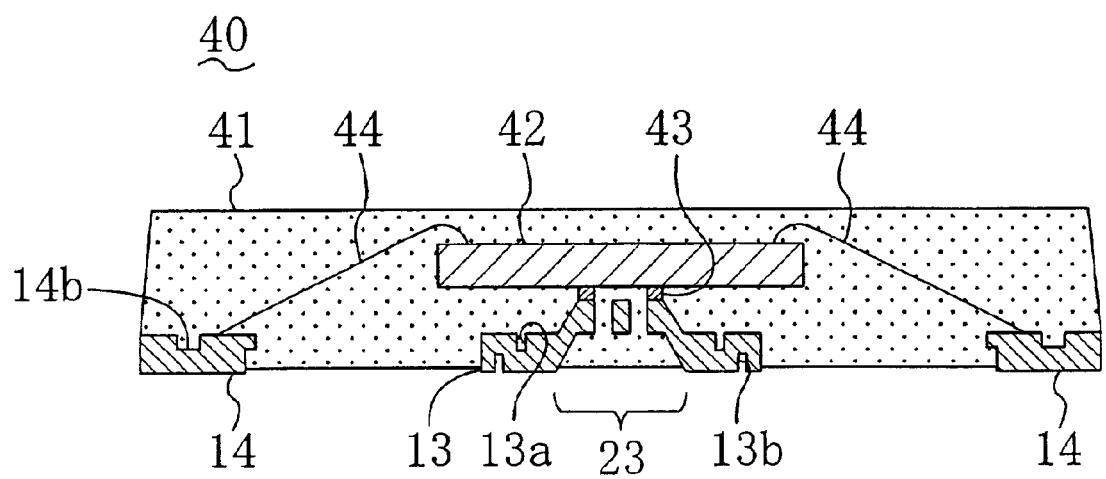
Figure 5B:
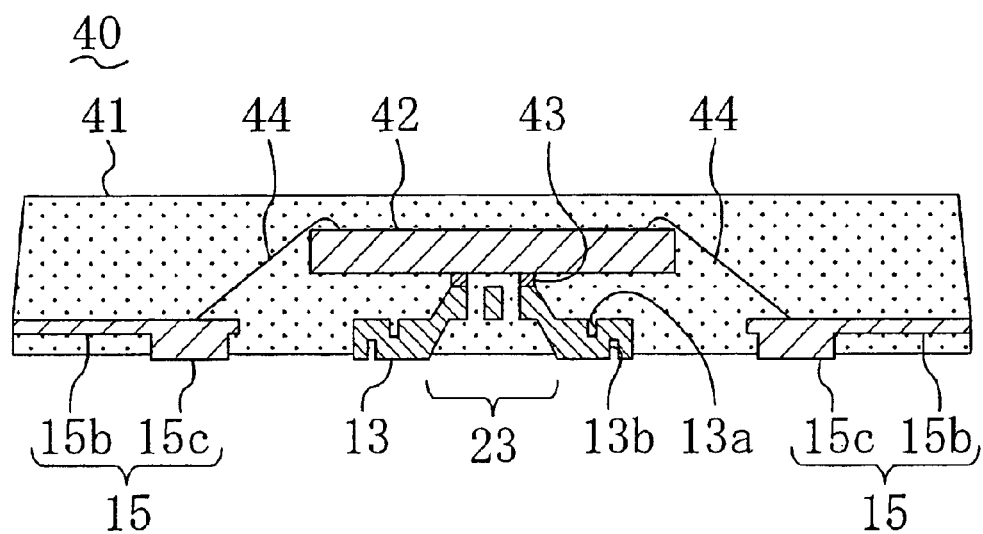

FIGS. 5A and 5B show the resin-sealed semiconductor device according to the second embodiment, of which FIG. 5A shows a cross-sectional structure thereof along the line Va—Va of FIGS. 4A and 4B and FIG. 5B shows a cross-sectional structure thereof along the line Vb—Vb of FIGS. 4A and 4B.

As shown in FIG. 5A, which is a cross section including the leads 14, a semiconductor chip 42 is fixedly attached onto the holding region 23 of the die pad portion 13 by using a conductive bonding material 43 composed of a silver paste material or the like. Some of the plurality of electrode pads (not shown) of the semiconductor chip 42 are electrically connected to the top surfaces of the leads 14 by metal fine wires 44 made of gold (Au).

Likewise, the other electrode pads of the semiconductor chip 42 are electrically connected to the top surfaces of the land leads 15 by the metal fine wires 44 as shown in FIG. 5B, which is a cross section including the land leads 15.

The semiconductor chip 42 and the metal fine wires 44 are covered with the resin sealed portion 41, while the die pad portion 13, the leads 14, and the land leads 15 are also covered with the resin sealed portion 41 except for the respective exposed portions thereof. The leads 14 and the land leads 15 have respective bottom portions protruding, by an amount corresponding to a thickness of about 20 $\mu$m, from the bottom surface of the resin sealed portion 41. The protruding portions serve as stand-offs when the semiconductor device is mounted on the mounting board. Likewise, the bottom surface of the die pad portion 13 also protrudes by the same amount to improve the efficiency of heat dissipation from the die pad portion 13 when the semiconductor device is mounted on the board by solder bonding.

Since the sealing resin material is filled in the space underlying the holding region 23 of the die pad portion 13, a pressure applied from above to the center holding section 23b defined by the surrounding openings 23a of the holding region 23 can be absorbed so that the reliability of the resin-sealed semiconductor device 40 is increased.

Figure 6:
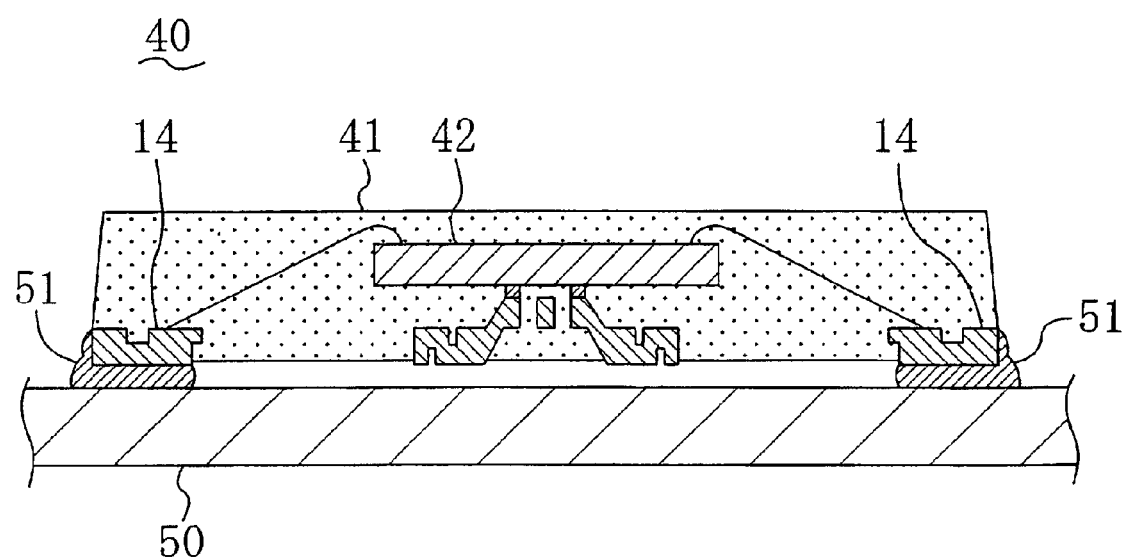
FIG. 6 is a cross-sectional view showing the resin-sealed semiconductor device according to the second embodiment which has been mounted on a mounting board.

As shown in FIG. 6, the resin sealed semiconductor device 40 is mounted by fixedly attaching the leads 14 to the electrode pads of a mounting board 50 by using the bonding material 51 such as a solder material. In contrast to the land leads 15 which are fixedly attached to the mounting board 50 only at the bottom surface portions thereof, the leads 14 are fixedly attached to the mounting board 50 not only at the bottom surface portions thereof but also at the side end surfaces thereof that have been disconnected and exposed.

Specifically, the land electrodes are normally fixedly attached to the mounting board only at the bottom surface portions thereof. In the second embodiment, however, the side end surfaces of the leads 14 which are the external ones of the land electrodes in a two-row configuration are exposed from the resin sealed portion 41. By applying the bonding material 51 also to the side end surfaces of the leads 14, therefore, a fillet is formed from the bonding material 51 so that each of the leads 14 has a two-point bonded structure in which it is bonded to the mounting board at the bottom and side end surfaces thereof. This enhances the electrical and mechanical strengths of connection to the mounting board 50 and thereby increases the reliability of the resin-sealed semiconductor device 40 including the mounting board 50.

Such an embodiment having the two-point bonded structure cannot be implemented by an LGA-type semiconductor device using a normal lead frame. Since the second embodiment has adopted the two-row configuration using two different types of leads which are the land electrodes (leads 14) and the lead land electrodes (land leads 15), the connecting sections can be provided even at the side surfaces of the resin sealed portion 41. Thus, the two-point bonded structure in which each of the leads 14 is bonded to the mounting board at the bottom and side end surfaces thereof significantly increases the reliability of connection to the mounting board 50.

Since the resin-sealed semiconductor device 40 according to the second embodiment has thus used the lead frame 10 according to the first embodiment, there can be implemented a package of surface mount type in which the two rows of land electrodes consisting of the leads 14 and the land leads 15 each connected electrically to the semiconductor chip 42 are arranged in a staggered pattern at the bottom surface of the resin sealed portion 41. As a result, the reliabilities of mounting position and mounting strength are increased greatly compared with the case where mounting to the board is effected by lead bonding in the QFP package shown in the conventional embodiment.

In addition, the plurality of openings 23a are formed in the holding region 23 composed of the elevated center portion of the die pad portion 13 and at least one of the openings 23a is provided at a position opposing a position at which the injection gate for the resin material is disposed. Consequently, the connecting sections 23c supporting the center holding section 23b defined by the surrounding openings 23a are placed at positions which do not obstruct the injected sealing resin material. As a result, the sealing resin material to be filled in the space underlying the die pad portion 13 flows consistently and a defect such as a void is less likely to occur in the resin sealed portion 41 composed of the sealing resin material injected in the space underlying the die pad portion 13 so that the reliability of the semiconductor device is increased.

As the resin-sealed semiconductor device 40 according to the second embodiment, a semiconductor device of LGA type can be formed from the lead frame 10 composed of a plate-like metal without using a wiring board composed of polyimide, ceramic, or plastic and provided with land electrodes as used in the conventional semiconductor device of BGA type. The resulting semiconductor device of LGA type is high in mass producibility and allows a reduction in fabrication cost.

A description will be given herein below to a method for fabricating the resin-sealed semiconductor device thus constructed with reference to the drawings.

FIGS. 7A to 7C and FIGS. 8A to 8C show the cross-sectional structures of the resin-sealed semiconductor device according to the second embodiment in the individual process steps of the fabrication method therefor.

Figure 7A:
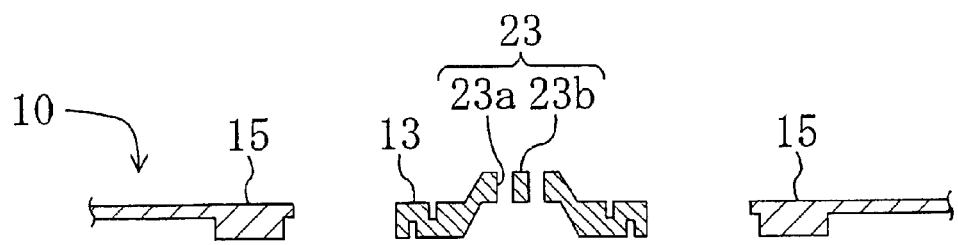
FIGS. 7A to 7C are structural cross-sectional views illustrating the individual process steps of a method for fabricating the resin-sealed semiconductor device according to the second embodiment.

First, as shown in FIG. 7A, the lead frame 10 composed of a plate-like metal according to the first embodiment is prepared. As described above, the nearly center portion of the die pad portion 13 has been formed into the elevated holding region 23 in a half-cut state by a pressing process. The four openings 23a each having an arcuate plan configuration are formed in the periphery of the holding region 23. The center portion defined by the respective inner edges (chords) of the surrounding openings 23a serves as the center holding section 23b having a square plan configuration and substantially holding the semiconductor chip on the top surface thereof.

The land leads 15 and the leads (not shown) are formed in an alternate arrangement around the die pad portion 13.

Figure 7B:
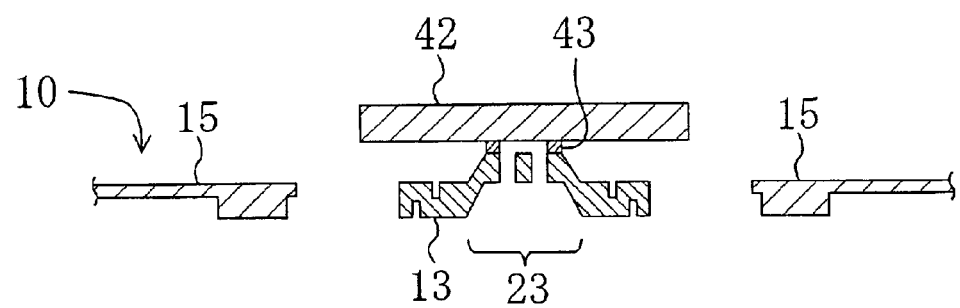

Next, as illustrated in the die bonding step shown in FIG. 7B, the semiconductor chip 42 is bonded onto the center holding section 23b of the die pad portion 13 of the prepared lead frame 10 by using the conductive bonding material 43 composed of a silver paste material or the like. In the die bonding step, it is necessary to apply the bonding material 43 such that the semiconductor chip 42 does not clog each of the openings 23a of the holding region 23.

Figure 7C:
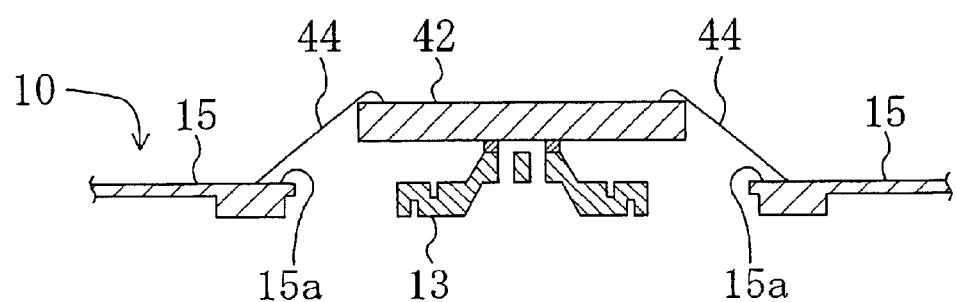

Next, as illustrated in the wire bonding step shown in FIG. 7C, the electrode pads (not shown) disposed on the principal surface of the semiconductor chip 42 fixedly attached onto the die pad portion 13 and the respective top surfaces of the end portions of the land leads 15 and the leads (not shown) of the lead frame 10 are electrically connected to each other by using the metal fine wires 44. The top surface of the end portion of each of the land leads 15 including the protruding portion 15a, which serves as a region to which the metal fine wire 44 is bonded, has an area of, e.g., 100 $\mu$m$^2$ or more. The same shall apply to the area of the top surface of the end portion of each of the leads.

The lead frame 10 has the holding region 23 provided with the center holding section 23b so that the semiconductor chip 42 is fixedly attached onto the center holding section 23b by using the bonding material 43. This prevents the semiconductor chip 42 placed on the lead frame 10 from being displaced or falling out of the die pad portion 13 due to mechanical impact undergone by the semiconductor chip 42 when the metal fine wires 44 are bonded or due to vibration or impact undergone by the semiconductor chip 42 when the lead frame 10 with the semiconductor chip 42 placed thereon is moved or transported in the wire bonding step.

Figure 8A:
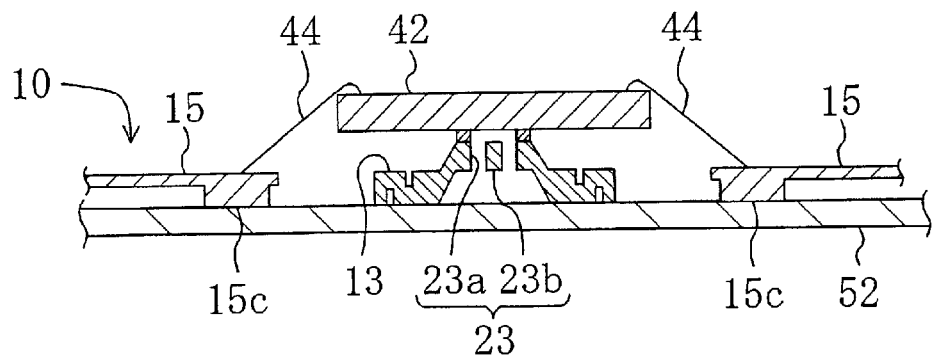
FIGS. 8A to 8C are structural cross-sectional views illustrating the individual process steps of a method for fabricating the resin-sealed semiconductor device according to the second embodiment.

Next, as shown in FIG. 8A, a sealing tape material or sealing sheet material 52 is attached to the bottom surface of the lead frame 10, i.e., to the respective bottom surfaces of the periphery of the die pad portion 13, the land portions 15c of the land leads 15, and the leads (not shown) such that the attached sealing tape material or sealing sheet material 52 is in close contact therewith. The sealing sheet material 52 is composed of, e.g., a resin material having no adhesion to the lead frame 10 and easily removable by a peel-off operation or the like after a resin sealing step, which will be described later, such that the sealing resin material does not reach the exposed portions from the resin sealed portion of the lead frame 10 in the resin sealing step. This prevents the attachment of resin flash to the respective bottom surfaces of the die pad portion 13, the land leads 15, and the leads (not shown) and thereby omits a water jet step normally required to remove the resin flash.

Figure 8B:
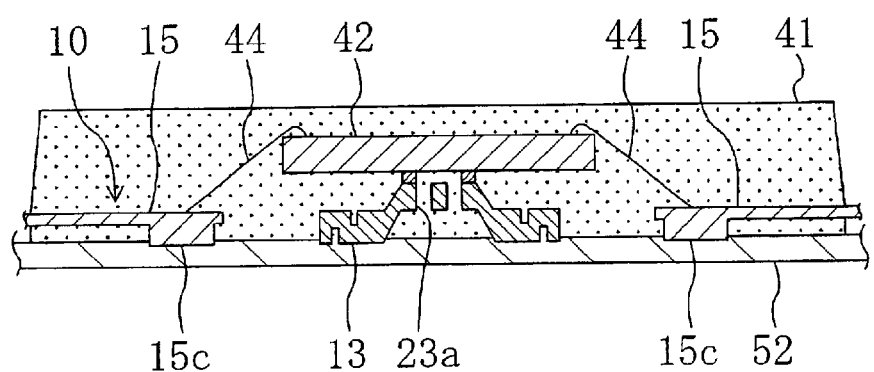

Then, as shown in the resin sealing step of FIG. 8B, the top surface of the lead frame 10 including the semiconductor chip 42, the metal fine wires 44, the die pad portion 13, the land leads 15, and the leads (not shown) is sealed with the sealing resin material with the sealing sheet member 52 attached to the lead frame 10, whereby the resin sealed portion 41 is formed. As a formation method, single-side sealing is performed here by transfer molding using a sealing mold composed of upper and lower molds. In injecting the sealing resin material, a pressure is applied to the connecting sections of the land leads 15 and the leads (not shown) to the framework portion, i.e., to the outer leads not sealed with the resin by pressing the upper and lower sealing molds via the sealing sheet material 52. By thus sealing the top surface of the lead frame 10 with the respective bottom surfaces of the land leads 15 and the leads (not shown) pressed onto the sealing sheet material 52 in close contact relation, the occurrence of the resin flash can be prevented reliably. In addition, so-called stand-offs can be formed on the respective bottom portions of the die pad portion 13, the land leads 15, and the leads (not shown) to be exposed from the resin sealed portion 41.

Since the openings 23a are formed in the holding region 23 of the die pad portion 13 of the lead frame 10 as described above, the injected sealing resin material is filled also in the space underlying the holding region 23 of the die pad portion 13. This prevents damage to the semiconductor chip 42 caused by the pressure applied by the injected sealing resin material only to a single side of the semiconductor chip 42.

Moreover, one of the four openings 23a each formed in the holding region 23 and having an arcuate plan configuration is provided at a position opposing the position (predetermined position) at which the injection gate for the sealing resin material provided in the sealing mold is disposed. As a result, the connecting sections supporting the center holding section 23b of the holding region 23 no more present large obstacles to the flow of the resin sealing material so that the sealing resin material flows consistently to the space underlying the holding region 23. This prevents the occurrence of a void in the sealing resin material filled in the space underlying the holding region 23.

In the step of attaching the sealing sheet material 52 to the bottom surface of the lead frame 10, it is possible to supply the sealing sheet material 52 to the interior of the upper or lower mold in advance and provide close contact therebetween prior to the injection of the sealing resin material. It is also possible to attach, in another step prior to sealing, the sealing sheet material 52 to the bottom surface of the lead frame 10 and supply, to the sealing mold, the lead frame 10 with the sealing sheet material 52 attached thereto.

Figure 8C:
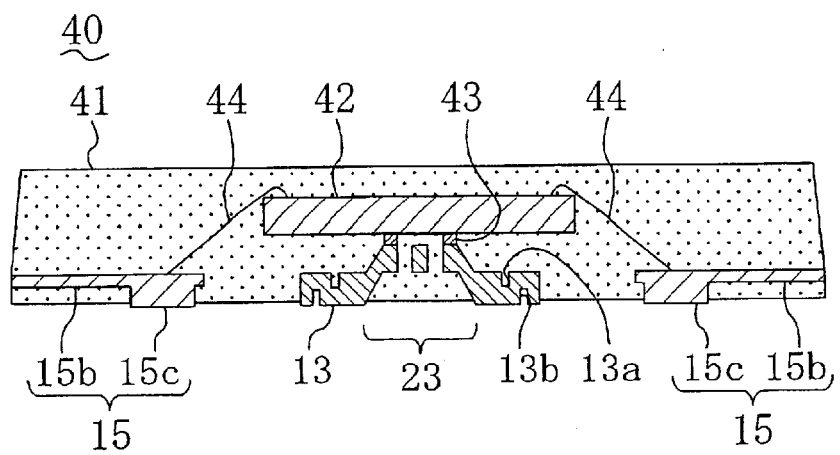
Figure 9A:
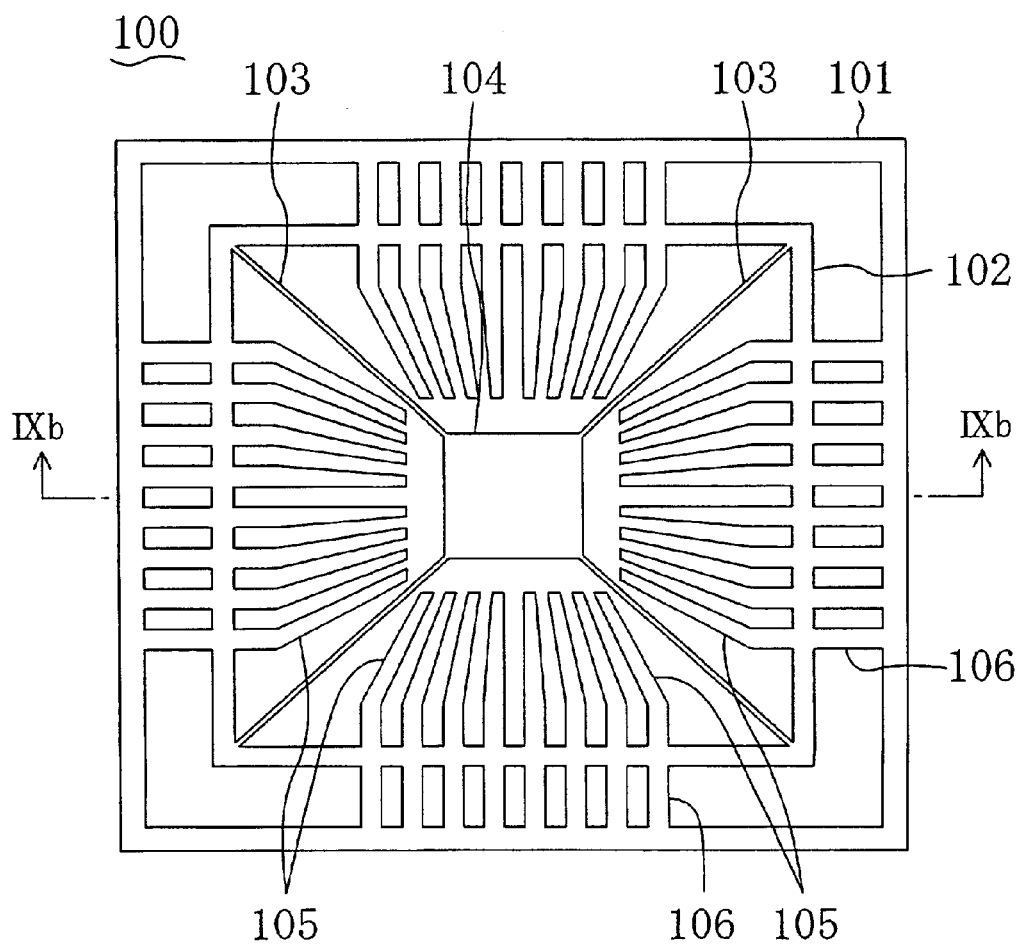
Figure 9B:
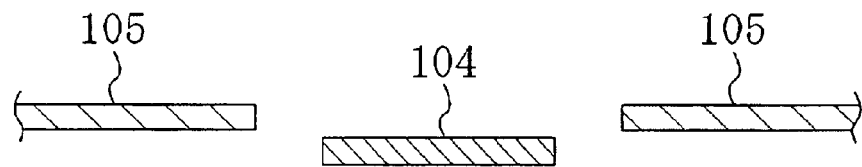
Figure 10:
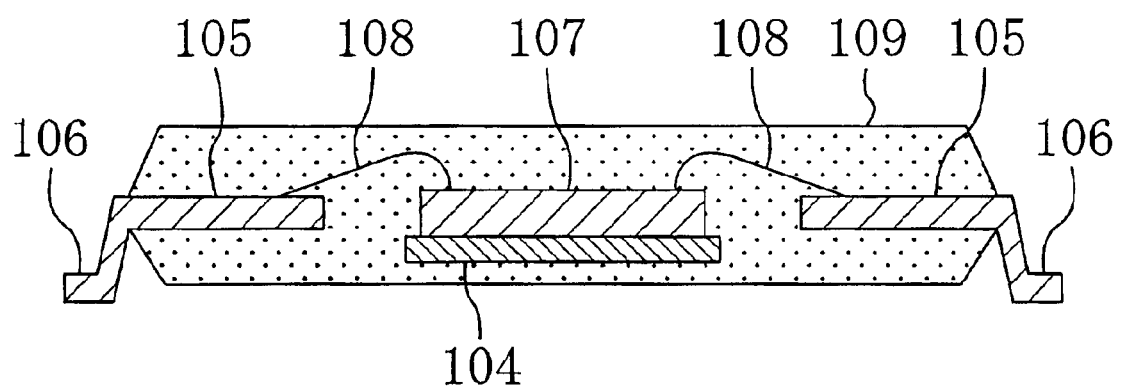
FIG. 10 is a cross-sectional view of a conventional resin-sealed semiconductor device.

Then, as shown in FIG. 8C, the sealing sheet material 52 is peeled off and removed from the lead frame 10 and each of the suspension leads, the land leads, and the leads is disconnected from the framework portion. Disconnection is performed such that the respective outer end surfaces of the leads are substantially flush with the side surfaces of the resin sealed portion 41. Consequently, the respective bottom portions of the leads 14 and the land leads 15 are exposed from the bottom surface of the resin sealed portion 41 to form the land electrodes, as shown in FIG. 4B. The bottom surface of the die pad portion 13 is also exposed so that a heat releasing property is improved. At this time, the respective side end surfaces of the leads 14 also form the external electrodes, as shown in FIG. 5A. The position at which the injection gate for the sealing resin material is disposed is recognizable since it is indicated by the trace of a runner portion that has been formed during the solidification of the sealing resin material and removed.

Thus, since the method for fabricating a resin-sealed semiconductor device according to the second embodiment has used the lead frame 10 according to first embodiment, the leads 14 disposed on the periphery of the bottom surface of the package (resin sealed portion 41) and the land portions 15c of the land leads 15, which are arranged alternately in a staggered pattern, form the external terminals in a two row configuration on the bottom surface of the package so that an LGA-type package is provided. Since the leads 14 that have been disconnected have the side end surfaces exposed from the side surfaces of the package, they can be bonded electrically and mechanically to the mounting board at both the side end and bottom surfaces thereof so that mounting reliability is increased.

Moreover, the openings 23a formed in the holding region 23 of the die pad portion 13 of the lead frame 10 are provided at positions opposing the injection gate for the sealing resin material so that the positions of the connecting sections 23c for connecting the center holding section 23b defined by the surrounding openings 23a to the die pad portion 13 shift from the direction in which the injected sealing resin material flows. As a result, the connecting sections 23c no more present large obstacles to the flow of the resin sealing material so that the sealing resin material flows consistently to the space underlying the holding region 23. This prevents the occurrence of a void in the sealing resin material filled in the space underlying the holding region 23 and thereby increases the reliability of the resin-sealed semiconductor device.

What is claimed is:

1. A lead frame comprising:

a die pad portion supported internally of a framework portion by suspension leads; and a plurality of leads each having one end connected to the framework portion and the other end opposed to the die pad portion, wherein the die pad portion has a holding region having a square plan configuration formed from a part of an upper surface of the die pad portion which has been elevated above the remaining part thereof, wherein the holding region has an opening formed to extend therethrough in a front-to-back direction of the die pad portion, wherein the opening formed in the holding region includes a plurality of openings and one of the openings is provided at a position opposing a position at which an injection gate for a sealing resin material is disposed, the opening formed in the holding region includes four openings, wherein the holding region has connecting sections provided between the adjacent openings and a center holding section having a square plan configuration defined by the respective inner edges of the surrounding openings which connect the adjacent connecting sections to each other, and wherein each of the edges of the center holding section is shifted from the framework portion by about 45°.

2. A resin-sealed semiconductor device comprising:

a die pad portion;

a semiconductor chip bonded to an upper surface of the die pad portion;

a plurality of leads disposed around the die pad portion to be electrically connected to the semiconductor chip by using conductor wires and having respective bottom surfaces exposed; and a resin sealed portion composed of a resin sealing material for integrally sealing the semiconductor chip, the die pad portion, and the plurality of leads, wherein the die pad portion has a holding region having a square plan configuration formed from a part of an upper surface of the die pad portion which has been elevated above the remaining part thereof, wherein the holding region has an opening formed to extend therethrough in a front-to-back direction of the die pad portion, wherein the opening formed in the holding region includes a plurality of openings and one of the openings is provided at a position opposing a position at which an injection gate for a sealing resin material used in forming the resin sealed portion is disposed, the opening formed in the holding region includes four openings, wherein the holding region has connecting sections provided between the adjacent openings and a center holding section defined by the respective inner edges of the surrounding openings which connect the adjacent connecting sections to each other and having a square plan configuration, and wherein each of the edges of the center holding section is shifted from the framework portion by about 45°.

3. The device of claim 2, wherein the sealing resin material is filled also in a space underlying the holding region of the die pad portion.

4. The device of claim 2, wherein that one of the plurality of leads disposed externally of the resin sealed portion has a bottom surface and a side end surface each exposed from the resin sealed portion.

5. The device of claim 2, wherein the plurality of leads are arranged in at least two rows around the die pad portion.

* * * * *